United States Patent
Le Foulgoc et al.

(10) Patent No.: US 9,179,530 B2
(45) Date of Patent: Nov. 3, 2015

(54) SYSTEM FOR GROUNDING IN AN ELECTRONIC DEVICE

(75) Inventors: Jean-Marc Le Foulgoc, Bourgbarre (FR); Philippe Lepoil, Chantepie (FR); Jean-Pierre Bertin, Guemene-Penfao (FR)

(73) Assignee: Thomson Licensing (FR)

( * ) Notice: Subject to any disclaimer, the term of this patent is extended or adjusted under 35 U.S.C. 154(b) by 32 days.

(21) Appl. No.: 13/808,003

(22) PCT Filed: Jul. 1, 2011

(86) PCT No.: PCT/EP2011/061150
§ 371 (c)(1),
(2), (4) Date: Jan. 2, 2013

(87) PCT Pub. No.: WO2012/001161
PCT Pub. Date: Jan. 5, 2012

(65) Prior Publication Data
US 2013/0114180 A1     May 9, 2013

(30) Foreign Application Priority Data
Jul. 2, 2010   (FR) ..................................... 10 55388

(51) Int. Cl.
*H05F 3/02*     (2006.01)
*H05K 9/00*     (2006.01)
(Continued)

(52) U.S. Cl.
CPC ................ *H05F 3/02* (2013.01); *H05K 1/0218* (2013.01); *H05K 1/144* (2013.01); *H05K 9/006* (2013.01); *H05K 1/0215* (2013.01); *H05K 1/141* (2013.01);
(Continued)

(58) Field of Classification Search
USPC .......................................................... 361/220
See application file for complete search history.

(56) References Cited

U.S. PATENT DOCUMENTS 5,394,010 A * 2/1995 Tazawa et al. ................ 257/686
5,613,860 A * 3/1997 Banakis et al. ................. 439/64
5,984,697 A   11/1999 Moran et al.
(Continued)

FOREIGN PATENT DOCUMENTS

EP            598028       5/1994
JP           53127262      3/1977
(Continued)

*Primary Examiner* — Ronald W Leja
(74) *Attorney, Agent, or Firm* — Jack Schwartz & Associates, PLLC

(57) ABSTRACT

A system for grounding in a electronic device is disclosed. The system comprises a first electronic board, this latter comprising a first ground plane and at least one footprint intended to connect the first ground plane to a component, the at least one footprint defining a closed line on said first electronic board adapted to connect the component, at least a second electronic board comprising a second ground plane, the second electronic board being superposed on the first electronic board, a grounding metallic piece comprising a wall perpendicular to said first electronic board and a base parallel to said first electronic board. The system being notable in that the metallic piece is dimensioned such that the wall corresponds to a perpendicular projection of said closed line defined by one of the at least one footprints and such that the shape of base corresponds to the shape defined by the closed line, and in that the base comprises elements providing a contact with the second electronic board thus electrically connecting the second ground plane with the first ground plane. The elements providing a contact with the second electronic board are for example contact strips or balls.

13 Claims, 5 Drawing Sheets

(51) Int. Cl.
*H05K 1/02* (2006.01)
*H05K 1/14* (2006.01)

(52) U.S. Cl.
CPC ............ *H05K 2201/10189* (2013.01); *H05K 2201/10371* (2013.01)

(56) References Cited

U.S. PATENT DOCUMENTS

| | | | |
|---|---|---|---|
| 6,149,443 | A | 11/2000 | Moran |
| 6,464,514 | B1 | 10/2002 | Tsai et al. |
| 7,259,969 | B2 | 8/2007 | Zarganis |
| 7,278,865 | B1 | 10/2007 | Su et al. |
| 7,559,775 | B2 | 7/2009 | Lin et al. |
| 2002/0053468 | A1 | 5/2002 | Yumi |
| 2002/0093803 | A1* | 7/2002 | Olzak et al. .................. 361/767 |
| 2004/0105243 | A1* | 6/2004 | Lee et al. ...................... 361/792 |
| 2008/0026608 | A1* | 1/2008 | Sano et al. ...................... 439/74 |
| 2008/0291639 | A1 | 11/2008 | Li et al. |
| 2009/0034218 | A1* | 2/2009 | Hu ................................. 361/772 |
| 2009/0124126 | A1* | 5/2009 | Cho et al. ................. 439/607.31 |
| 2009/0135576 | A1 | 5/2009 | Chao |
| 2009/0257614 | A1* | 10/2009 | Mei et al. ...................... 381/355 |
| 2009/0298357 | A1 | 12/2009 | Tachikawa et al. |
| 2010/0248655 | A1* | 9/2010 | Yahagi et al. ................ 455/90.3 |
| 2013/0083494 | A1* | 4/2013 | Syal et al. ..................... 361/735 |
| 2014/0160699 | A1* | 6/2014 | Zhang et al. ................. 361/752 |

FOREIGN PATENT DOCUMENTS

| | | |
|---|---|---|
| JP | 622297 | 1/1987 |
| JP | 8181476 | 7/1996 |
| JP | 1187872 | 3/1999 |
| JP | 2009111115 | 5/2009 |

* cited by examiner

SYSTEM FOR GROUNDING IN AN ELECTRONIC DEVICE

This application claims the benefit, under 35 U.S.C. §365 of International Application PCT/EP2011/061150, filed, which was published in accordance with PCT Article 21(2) on Jan. 5, 2012 in English and which claims the benefit of French patent application No. 1055388, filed Jul. 2, 2010.

DOMAIN OF THE INVENTION

The invention relates to the general domain of electronic board assembly. More specifically, the invention relates to a system for grounding in an electronic device.

PRIOR ART

Electrical bonding in an electronic device is very important and absolutely necessary to successfully pass the certifications relating to electrostatic discharges and electromagnetic compatibility.

In particular, to respond to the constraints of integration and modularity of products, an electronic device is today a modular system that comprises a motherboard and electronic modules carrying out a specific function. Antenna effects between the motherboard and the superposed module produce particularly disturbing radiation. In addition, the casing unit of electronic devices today is more and more often made of plastic. Unlike a metallic casing, a plastic casing cannot provide the ground return. The integration of modules on the electronic boards in plastic units is more and more sensitive.

In addition, some functions, for example in digital decoders (set top boxes) such as analogue reception of satellite, cable or radio signals or demodulation, are particularly sensitive to electromagnetic radiation and to electrostatic discharges. Modules integrating these functions are protected by a shielding also connected to the grounding.

Various assembly solutions are possible but not always compatible with the production requirements as they require a complex manual intervention implicating a heightened manufacturing cost or because they use complex components (such as self-adhesive seals, metallic clips or conductive foam) thus implicating a heightened BOM cost. In addition, a surface or footprint is reserved and dedicated on the motherboard to receive these specific components.

These methods pose the technical problem of cost, and of the modularity of the grounding of boards in the electronic device. A simple and inexpensive solution to the grounding of modules dedicated to specific functions on an electronic board is thus required.

SUMMARY OF THE INVENTION

The purpose of the invention is to overcome at least one of the disadvantages of the prior art by proposing a system for grounding in a electronic device comprising a first electronic board, this latter comprising a first ground plane and at least one footprint intended to connect the first ground plane to a component, where the at least one footprint defines a closed line on said first electronic board adapted to connect said component; at least a second electronic board comprising a second ground plane, the second electronic board being superposed on the first electronic board, a grounding metallic piece comprising a wall perpendicular to the first electronic board and a base parallel to the first electronic board. The system being notable in that the metallic piece is dimensioned such that the wall corresponds to a projection of said closed line defined by one of the at least one footprint of the first electronic board and that the shape of the base corresponds to the shape defined by the closed line, and notable in that the base comprises elements providing a contact with the second electronic board thus electrically connecting the second ground plane with the first ground plane.

In the prior art the components, such as metallic clips, electrically connecting the grounding of 2 electronic boards via a contact, require a footprint dedicated to these specific components, a manual intervention for the assembly of components and generally several components are necessary in order to provide correct bonding of the electrical grounding.

The principle of the invention is to use the flexibility of this first electronic board to implement in it a very simple metallic piece having on its base elements to provide electrical bonding with the superposed electronic board. This piece is assembled and soldered in a totally integrated way into the existing assembly line using its contour or vertical wall. By flexibility of the first electronic board, it should be understand that the footprint used on the board, is first of all designed to receive an electronic component, such as metal shielding case, and is reused for grounding purpose when electronic component is not used or implemented on the second electronic board for a given product configuration. Therefore, the shape and dimension of the metallic piece is determined by the footprint for the electronic component originally planned to be used.

According to a particular embodiment of the invention, the elements providing a contact with the second electronic board are contact strips. According to a variant, the elements providing a contact with the second electronic board are balls. Thus, the second electronic board is advantageously electrically connected to the first board using for example a connector and pressing upon the contact strips or balls of the metallic piece. The bonding of the electrical grounding is provided by the metallic piece.

According to another particular embodiment of the invention, the wall comprises at least two pads in contact with one of the at least one footprints.

In fact according to different variants, the footprint is continuous, for example in rectangular form, or discontinuous, comprising for example the corners of the rectangle only. In this variant, the rectangle, continuous or not, defines the closed line which by projection, perpendicular to the board, determines the shape and dimension of the metallic piece. The wall of the metal piece adapted to the footprint is advantageously continuous through the whole length of the perimeter of the base or, according to a variant, for example composed of four pads soldered to the corners of the rectangle forming the footprint. However, those skilled in the art will appreciate that a maximum contact surface between the wall and the footprint provides a more efficient bonding.

According to a particularly advantageous aspect of the invention, the metallic piece is assembled and soldered on the first electronic board. Thus, the assembly of the component providing the bonding is totally integrated into the existing assembly line.

According to another particular characteristic of the invention, the metallic piece also provides the shielding of components positioned between the first electronic board and the metallic piece. The shape of the metallic piece comprising a wall defined by vertical projection and a superior base is adapted to cover components on the first board. According to a variant, components are soldered onto the surface of the first board positioned under the metallic piece. The metallic piece, connected to the ground plane, advantageously thus provides a function of electromagnetic protection of components positioned below.

According to another particularly advantageous aspect of the invention, the system is modular as it enables a second electronic board to be grounded, among a plurality of electronic boards, using a metallic piece, among a plurality of metallic pieces, adapted to a plurality of footprints of the first electronic board. Thus by using different metallic pieces adapted to the form of the footprint on the first board, this system is particularly well adapted to the constraints of integration and product modularity.

According to another particular embodiment of the invention, the footprint intended to connect the first ground plane to a component is a footprint of a shielding component. The surface of this footprint is then advantageously increased. According to another particular embodiment of the invention, the system also comprises a shielding component connected onto the second electronic board. According to a variant, the shielding component is positioned between said metallic piece and the second electronic board thus electrically connecting the second ground plane with the first ground plane. According to another variant, the second electronic board is positioned between said metallic piece and the shielding component. The second electronic board thus comprises a first ground footprint intended to connect the shielding component to the second ground plane and a second ground footprint intended to connect the elements of the base of the metallic piece with the same second ground plane. Thus the first ground plane, the second ground plane, and the grounding of the shielding component are electrically connected. According to these embodiments, the second electronic board is thus superposed above the metallic piece on either one side or the other indifferently, the side on which the shielding component is connected or the other side thus comprising a footprint intended to connect to the second ground plane. The system enables a second electronic board to be grounded on a first board on which only a footprint of the shield component was planned to provide the bonding of the shielding.

According to another particular embodiment of the invention, the system does not comprise a shielding component. The second electronic board then comprises at least one footprint intended to connect the second ground plane to a component, the at least one footprint of the second electronic board being in contact with the elements of the metallic piece thus connecting the second ground plane with the first ground plane. In this case, one side is not distinguished with respect to another on the second electronic board.

According to another particularly advantageous aspect of the invention, the electronic device comprises a plastic casing. According to another particularly advantageous aspect of the invention, the electronic device is a decoder. The system for grounding according to an embodiment of the invention is particularly well adapted to a system in which the plastic casing can not provide bonding, for example set top boxes

BRIEF DESCRIPTION OF THE FIGURES

The invention will be better understood and illustrated by means of embodiments and advantageous implementations, by no means limiting, with reference to the figures in the appendix, wherein.

DETAILED DESCRIPTION OF EMBODIMENTS OF THE INVENTION

Figure 1:
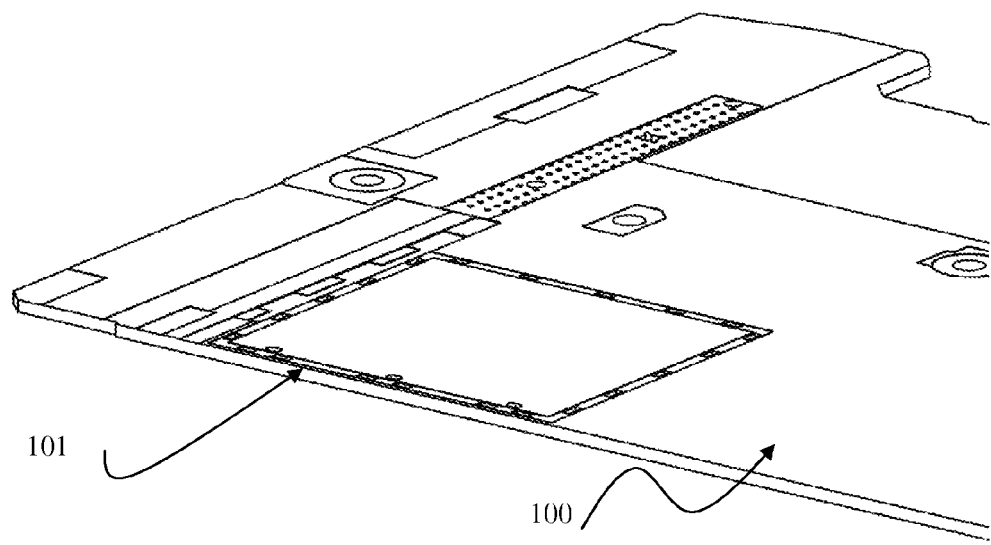
FIG. 1 shows a footprint on an electronic board comprised in the system according to an embodiment.

FIG. 1 shows a footprint 101 on an electronic board 100 comprised in the system according to an embodiment. The electronic board is for example the motherboard of an electronic device. The different electronic components are assembled and soldered onto this electronic board. The footprint 101 defines a close line following, for instance, a rectangular form as represented on FIG. 1.

Figure 2:
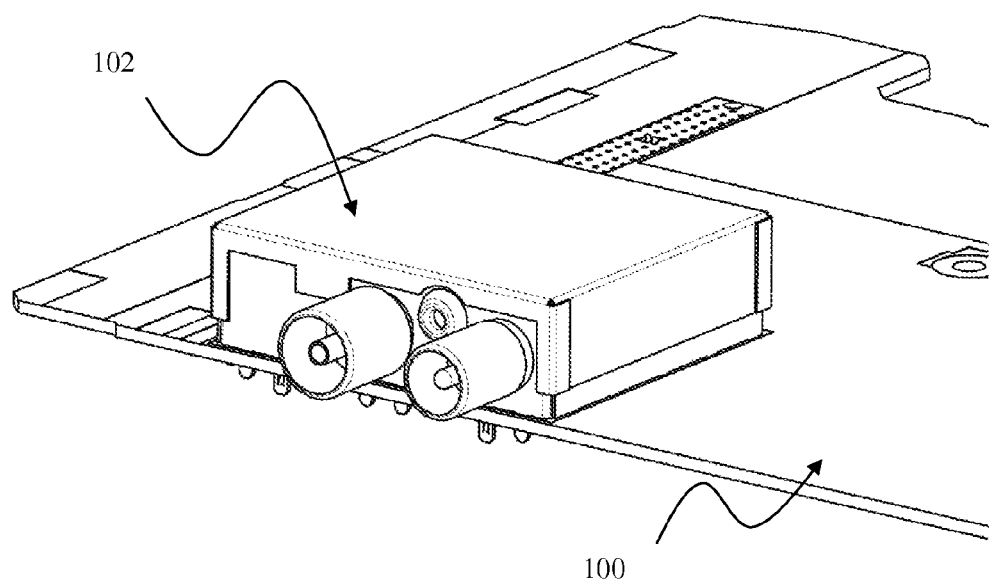
FIG. 2 shows a shielding component on an electronic board according to the prior art.

FIG. 2 shows a shielding component 102 on an electronic board 100. Among the components, some components sensitive to radiation are protected by a shielding. The shielding is soldered onto the footprint reserved for this purpose on the motherboard. The ground plane of the shielding is thus connected to the ground plane of the motherboard.

Figure 3:
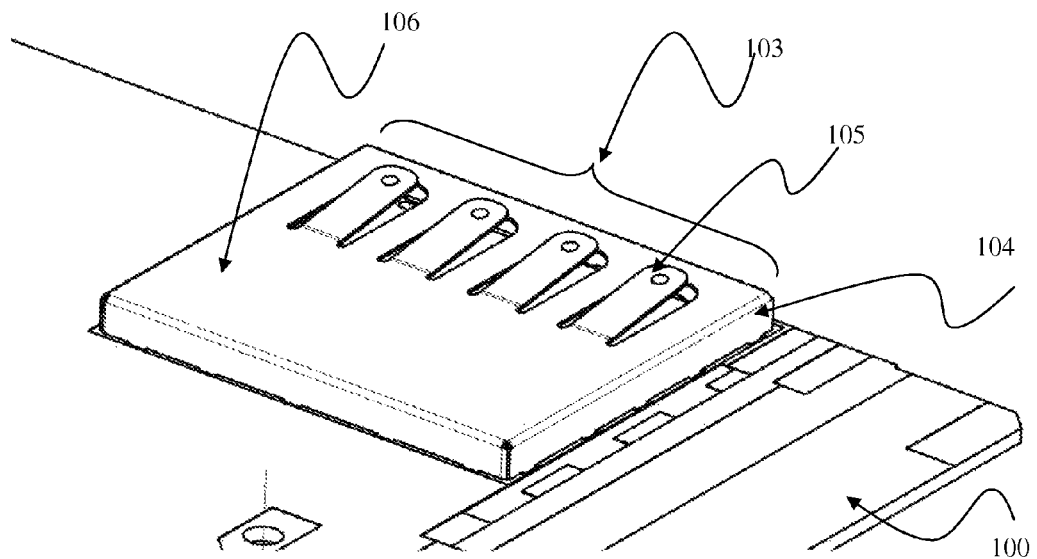
FIG. 3 shows a metallic piece on an electronic board comprised in the system according to a preferred embodiment.

FIG. 3 shows a metallic piece 103 on an electronic board 100 comprised in the system according to a preferred embodiment. The metallic piece comprises a base 106 and a contour or wall 104. The wall 104 is dimensioned in a way to be adapted to the form of the footprint initially designed for the shielding component. The wall is vertical, perpendicular to the motherboard, and corresponds to a vertical projection of the closed line formed by the rectangular form of the footprint. The base is horizontal, parallel to the board. The shape of horizontal base corresponds to the shape defined by closed line. The shape is for instance rectangular. The base comprises elements providing the contact with another electronic board. According to a preferred embodiment these elements are contact strips 105. Unlike the invention, known components for grounding an electronic board are not adapted to be soldered on the footprint dedicated to the shielding component, and therefore need a supplementary, non reusable, dedicated footprints. The shape and the dimension of the grounding component according to the invention are determined from the footprint while in the prior art, the shape and the form of the footprint is determined by the grounding components.

Figure 4:
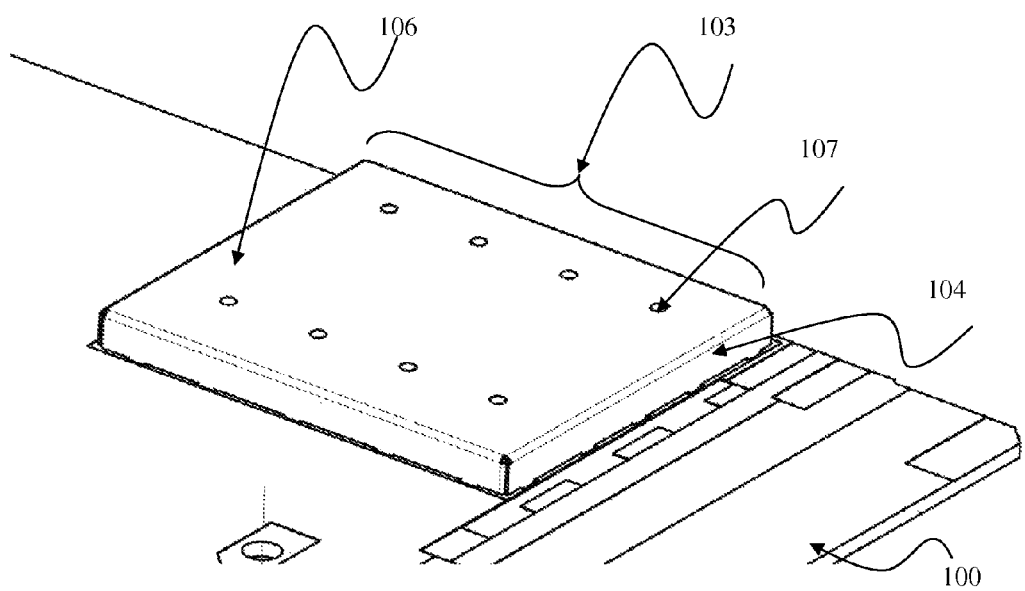
FIG. 4 shows a metallic piece on an electronic board comprised in the system according to another preferred embodiment.

FIG. 4 shows a metallic piece 103 on an electronic board 100 comprised in the system according to another preferred embodiment. According to another preferred embodiment these contact elements are balls 107.

Figure 5:
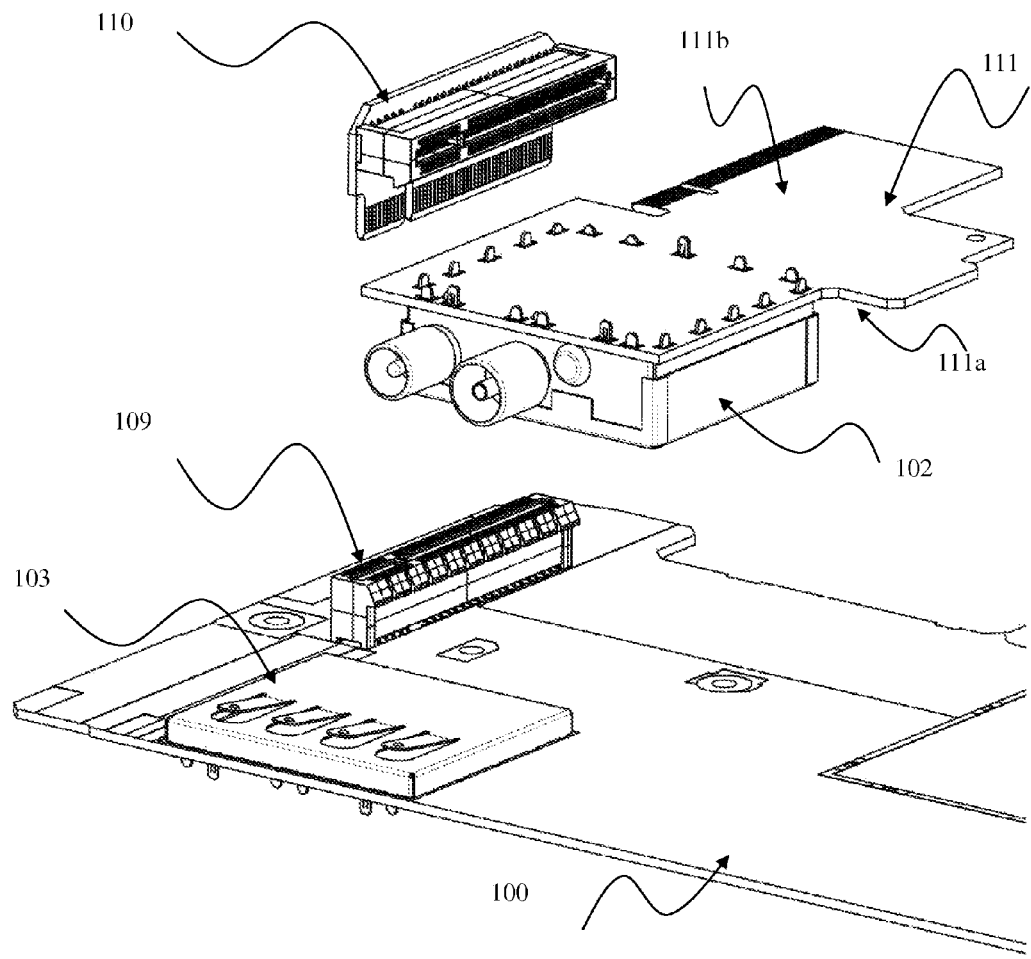
FIG. 5 shows the different elements comprised in the system according to a preferred embodiment.

FIG. 5 shows the different elements comprised in the system according to a preferred embodiment. The system comprises a first electronic board 100, a second electronic board 111, a metallic piece 103 providing the bonding between the first and second electronic board. The first board is for example a motherboard, the second electronic board is for example a daughterboard or a module (NIM) implementing an interchangeable or additional function. In the example in a digital television decoder (set top box), the motherboard comprises the functions of decoding and displaying of television signals. A module carries out for example the functions of reception and demodulation (front-end) of signals for satellite, cable or radio transmission. The module 111 thus comprises sensitive components protected by a shielding 102. Or again, a module implements for example access control functions of different providers. Thus, with a single motherboard 100 and a determined assembly of modules 111, electronic devices with different characteristics are available. This is the modularity of products. A connector 109 on the first board 100 and a connector 110 on the second board 111 provide continuity of logical signals in the system when the two boards are connected.

Figure 6:
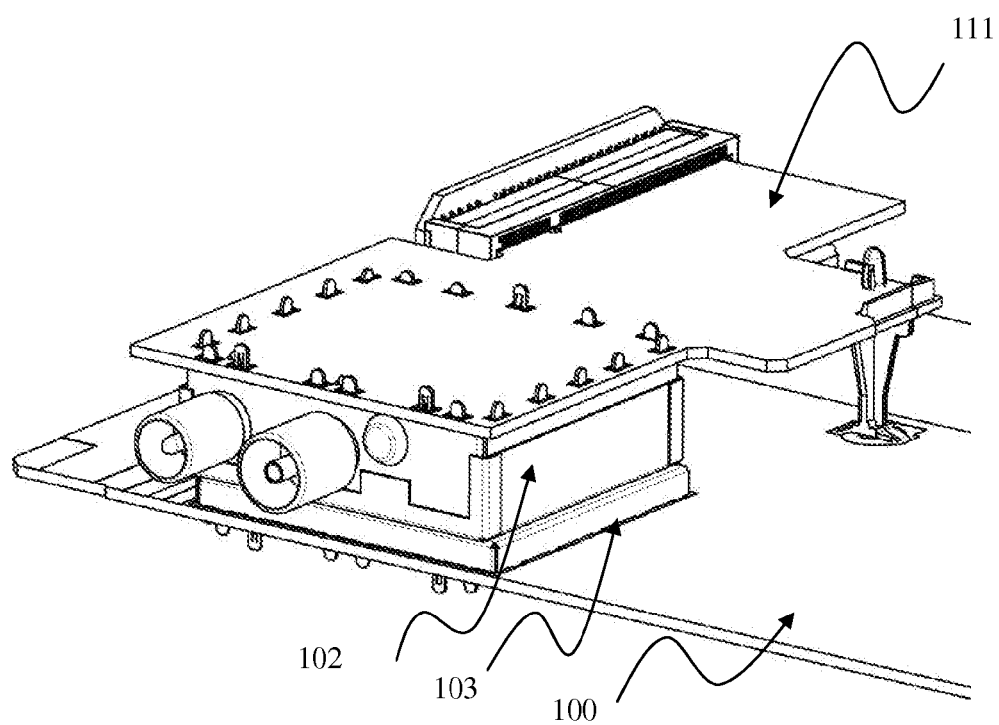
FIG. 6 shows the different assembled elements comprised in the system according to a preferred embodiment.

FIG. 6 shows the different assembled elements comprised in the system according to a preferred embodiment. The connectors 109 and 110 are assembled, they maintain the second board 111 on the first board 110. According to a refinement, a base 112 helps to maintain the second electronic board 111 superposed over the first electronic board 110. The second board 111 is in contact with the contact strips of the metallic piece 103 soldered onto the first board. According to the embodiment shown, the shielding component 102 is on one hand assembled on the second board 111 connected to the second ground plane. The shielding component 102 is on the other hand in contact with the contact strips connected to the first ground plane. Thus this shielding component 102 and the metallic piece 103 connect the first and second ground planes. According to another embodiment not shown, the second electronic board is positioned bottom-up, that is to say that the second electronic board is in contact with the metallic piece via a ground footprint, the first and second ground planes are thus connected. In this case, the shielding component being connected to the second ground plane by its assembly on the second board, it is also connected to the grounding of the system. A side is distinguished (111a), for example called the up side, on to which is connected the shielding component, and a side (111b) for example called the bottom side that has ground footprints. The system thus advantageously authorizes an assembly via either side.

Figure 7:
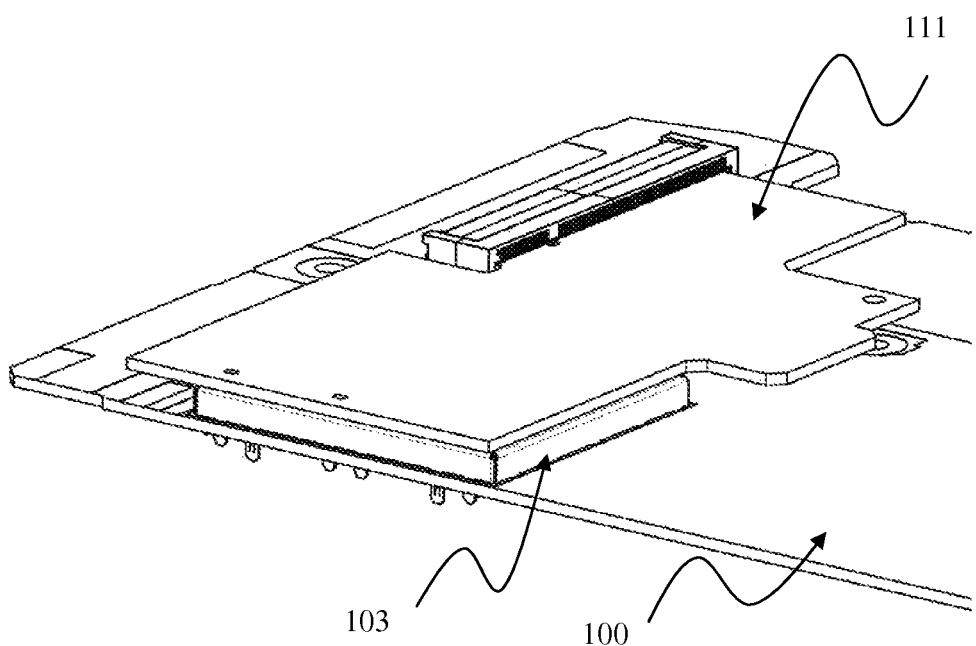
FIG. 7 shows the different elements comprised in the system according to another preferred embodiment.

FIG. 7 shows the different assembled elements comprised in the system according to another preferred embodiment. In this embodiment, there is no shielding component on the second board. The connectors 109 and 110 are assembled, they maintain the second board 111 on the first board 110. In this variant, only the connectors maintain the board, no base aids in the support. The second board 111 is in contact with the contact strips of the metallic piece 103 soldered onto the first board. According to this embodiment, the second board comprises a ground footprint. It is with this ground footprint that the contact strips are in contact providing the bonding of the system.

Naturally, the invention is not limited to the embodiments previously described. In particular, the invention is compatible with several modules connected onto the motherboard.

According to variants, elements other than contact strips or balls provide the contact between the metallic piece and the second electronic board.

The invention claimed is:

1. A system for grounding in an electronic device comprising:
    a first electronic board comprising a first ground plane and at least one footprint intended to connect said first ground plane to a component, said at least one footprint defining a closed line on said first electronic board adapted to connect said component;
    at least a second electronic board comprising a second ground plane, said second electronic board being superposed onto the first electronic board,
    a grounding metallic piece, wherein said metallic piece comprises a wall perpendicular to said first electronic board and a base parallel to said first electronic board:
    the metallic piece being dimensioned such that the wall corresponds to a projection of said closed line defined by one of said at least one footprints, and such that the shape of base corresponds to the shape defined by said closed line;
    the base comprising elements providing a contact with said second electronic board thus electrically connecting the second ground plane with said first ground plane.

2. The system for grounding according to claim 1 wherein said elements providing a contact with said second electronic board are contact strips.

3. The system for grounding according to claim 1 wherein said elements providing a contact with said second electronic board are balls.

4. The system for grounding according to claim 1 wherein said wall comprises at least two pads in contact with one said at least one footprints.

5. The system for grounding according to claim 1, wherein said metallic piece is assembled and soldered on said first electronic board.

6. The system for grounding according to claim 1, wherein components are positioned between said first electronic board and the metallic piece, said metallic piece also providing the shielding of said components.

7. The system for grounding according to claim 1, wherein said system is modular as it enables a second electronic board among a plurality of electronic boards, to be grounded, using a metallic piece, among a plurality of metallic pieces, adapted to a plurality of footprints of said first electronic board.

8. The system for grounding according to claim 1, wherein said footprint intended to connect said first ground plane to component is a shielding component footprint.

9. The system for grounding according to claim 1, wherein the system also comprises a shielding component connected onto the second electronic board, said shielding component being placed between said metallic piece and the second electronic board thus electrically connecting said second ground plane with said first ground plane.

10. The system for grounding according to claim 1, wherein said second electronic board comprises at least one footprint intended to connect said second ground plane to component, the at least one footprint of the second electronic board being in contact with said elements of the metallic piece thus electrically connecting said second ground plane with said first ground plane.

11. The system for grounding according to claim 1, wherein said second electronic board is superposed above said metallic piece on either one side or the other indifferently, the side onto which is connected said shielding component or the other side onto which is connected said shielding component or the other side comprising then a footprint intended to connect said second ground plane.

12. The system for grounding according to claim 1, wherein said electronic device comprises a plastic casing.

13. The system for grounding according to claim 1, wherein said electronic device is decoder (set top box).

* * * * *